(12) United States Patent
Altman et al.

(10) Patent No.: US 12,241,643 B2
(45) Date of Patent: Mar. 4, 2025

(54) VENTING FOR ENCLOSURE COOLING

(71) Applicant: Ice Qube, Inc., Greensburg, PA (US)

(72) Inventors: Ridge Altman, Greensburg, PA (US); Jeffrey S. Palmer, Greensburg, PA (US)

(73) Assignee: Ice Qube, Inc., Greensburg, PA (US)

( * ) Notice: Subject to any disclaimer, the term of this patent is extended or adjusted under 35 U.S.C. 154(b) by 0 days.

(21) Appl. No.: 17/395,871

(22) Filed: Aug. 6, 2021

(65) Prior Publication Data
US 2022/0042693 A1   Feb. 10, 2022

Related U.S. Application Data

(60) Provisional application No. 63/062,459, filed on Aug. 7, 2020, provisional application No. 63/062,316, filed on Aug. 6, 2020.

(51) Int. Cl.
*F24F 11/00* (2018.01)
*F24F 11/61* (2018.01)
*F24F 11/72* (2018.01)

(52) U.S. Cl.
CPC .......... *F24F 11/0001* (2013.01); *F24F 11/61* (2018.01); *F24F 11/72* (2018.01); *F24F 2011/0002* (2013.01)

(58) Field of Classification Search
CPC ........ F24F 11/0001; F24F 11/61; F24F 11/72; F24F 2011/0002; F24F 2110/10; F24F 2221/52; H05K 7/20209; H05K 7/20727; H05K 7/20836
See application file for complete search history.

(56) References Cited

U.S. PATENT DOCUMENTS

| | | | | |
|---|---|---|---|---|
| 2009/0117843 A1* | 5/2009 | Palmer | ...................... | F24F 7/06 454/239 |
| 2009/0321039 A1* | 12/2009 | Therrien | ............... | H05K 7/2059 700/275 |
| 2013/0038141 A1* | 2/2013 | Ge | ..................... | H05K 7/20209 307/130 |
| 2015/0075373 A1* | 3/2015 | Miller | ................ | B01D 46/0032 96/400 |
| 2016/0091216 A1* | 3/2016 | Tran | ..................... | F24F 13/1426 454/241 |
| 2018/0335220 A1* | 11/2018 | Matambo | .................. | F24F 11/74 |
| 2020/0132335 A1* | 4/2020 | Forest | ................... | F28D 7/1607 |

* cited by examiner

*Primary Examiner* — Nelson J Nieves
*Assistant Examiner* — Matthew John Moscola
(74) *Attorney, Agent, or Firm* — Gabriel & Co; Andrew M Gabriel

(57) ABSTRACT

One example provides a cooling system, including: an ambient air inlet configured for attachment to an enclosure to be cooled, the enclosure including one or more heat generating components; an enclosure air outlet configured for attachment to the enclosure; a fan; and a controller configured to: determine one or more signals; and responsive to the one or more signals, operate the fan to impart movement of air within the enclosure; whereby operation of the fan mechanically activates one or more of the ambient air inlet and the enclosure air outlet.

2 Claims, 4 Drawing Sheets

VENTING FOR ENCLOSURE COOLING

CROSS-REFERENCE TO RELATED APPLICATIONS

This application claims priority to U.S. provisional patent application Ser. Nos. 63/062,316, filed Aug. 6, 2020, and 63/062,459, filed Aug. 7, 2020, both having the same title, namely "VENTING APPARATUS FOR ENCLOSURE COOLING." The contents of each of these provisional applications are incorporated by reference in their entirety.

FIELD

The subject matter disclosed herein relates to enclosure cooling systems and related techniques. Some of the subject matter disclosed herein relates to a venting system that is mounted to the side of an enclosure and used for cooling items within the enclosure, such as heat generating components, by way of example electronics used in the telecommunications industry, computing systems or servers, etc.

BACKGROUND

Industry and manufacturing have emerged with the widespread use of enclosures for a variety of items, for example electronics or other items that require protection from the elements as well as cooling. To protect these items from harsh environments, they are typically placed in sealed enclosures or cabinets that permit efficient operation without the threat of being exposed to exterior contaminates including dust, residue, rain and liquids that have the potential to cause serious damage. Since the items (such as electronics used in the telecommunications industry or like equipment) often generate heat within the enclosure, various cooling equipment such as air conditioners, heat exchangers, in-line compressed air coolers and filtered fan systems are provided and used to maintain required operating temperatures within the enclosure. In some cases, such cooling equipment may be provided as an addition to the enclosure, e.g., a cooling system may be provided separately and attached to an enclosure.

BRIEF SUMMARY

In summary, one embodiment provides a cooling system, comprising: an ambient air inlet configured for attachment to an enclosure to be cooled, the enclosure including one or more heat generating components; an enclosure air outlet configured for attachment to the enclosure; a fan; and a controller configured to: determine one or more signals; and responsive to the one or more signals, operate the fan to impart movement of air within the enclosure; whereby operation of the fan mechanically activates one or more of the ambient air inlet and the enclosure air outlet.

Another embodiment provides a method, comprising: providing a cooling system comprising: an ambient air inlet configured for attachment to an enclosure to be cooled, the enclosure including one or more heat generating components; an enclosure air outlet configured for attachment to the enclosure; a fan; and a controller; determining, with the controller, one or more signals; and responsive to the one or more signals, operating the fan to impart movement of air within the enclosure; whereby operation of the fan mechanically activates one or more of the ambient air inlet and the enclosure air outlet.

A further embodiment provides a system, comprising: an enclosure configured for housing one or more heat generating components; and a cooling system, comprising: an ambient air inlet configured for attachment to an enclosure to be cooled, the enclosure including one or more heat generating components; an enclosure air outlet configured for attachment to the enclosure; a fan; and a controller configured to: determine one or more signals; and responsive to the one or more signals, operate the fan to impart movement of air within the enclosure; whereby operation of the fan mechanically activates one or more of the ambient air inlet and the enclosure air outlet.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "in an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, etc. In other instances, well-known structures, materials, or operations are not shown or described in detail to avoid obfuscation.

An embodiment provides a venting system that includes one or more fans configured to remove heated enclosure air and facilitate entry of cooling ambient air. The venting system includes protective features, e.g., for preventing rain entry. The venting system further includes one or more gravity or mechanical dampers, a relay, and a controller. In an embodiment, a venting system controller acts to operate the fan based on thermostat or other signal data such as power data or availability. In an embodiment, the control of the fan passively or indirectly controls opening and closing of the one or more dampers.

Figure 1:
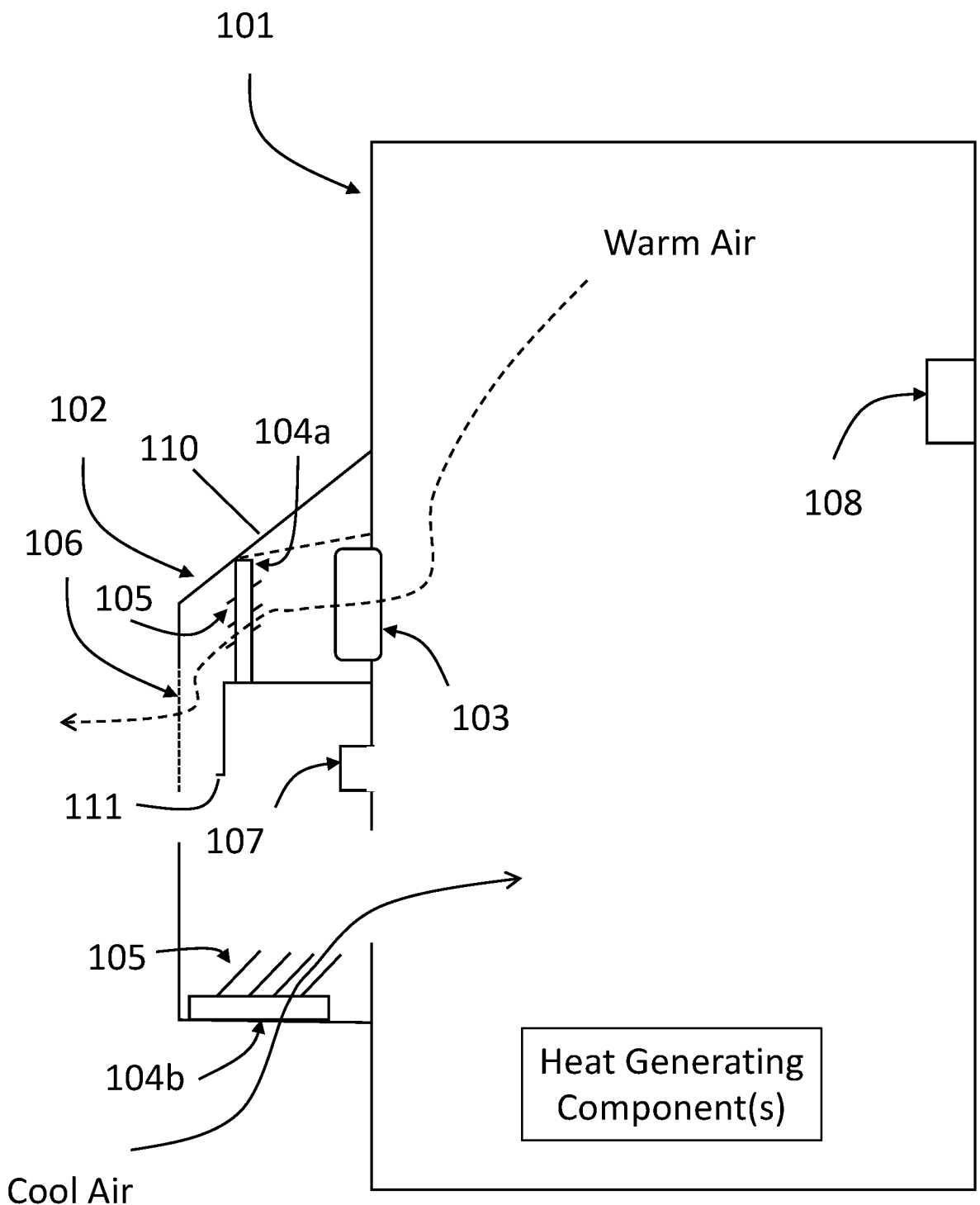
FIG. 1 illustrates views of an example venting system.

Illustrated in FIG. 1 is an example enclosure 101 that contains heat generating equipment or components to which a venting system 102 is attached. The attachment may be reversible, e.g., by way of a securing mechanism such as a series of screws, or the attachment may be permanent. Moreover, the venting system 102 may be integrated (formed as part of) the enclosure 101, in whole or in part.

In the example illustrated in FIG. 1, the venting system 102 includes fan 103 that operates to expel or vent warm air from the enclosure 101 to the ambient environment, as illustrated in the dashed arrow. The warm air of the enclosure 101 is passed through a conduit that includes a damper 104a that includes one or more blades 105. The conduit may be formed, as in the example of FIG. 1, at least in part by a sloped roof or top area, indicated at 110 in FIG. 1. The underside of the sloped roof or top area 110 may include a part fit between the damper 104a and the fan 103, as indicated by the dashed line fit between the fan 103 and damper 104a in FIG. 1. The lower area or floor of the conduit may be formed by a stepped or shaped element 111. The stepped or shaped element 111 may be sloped, similar sloped roof of top area 110 or may take a more angular shape, as illustrated in the example of FIG. 1. In the example of FIG. 1, the stepped or shaped element 111 includes a shelf just interior to an opening, which may be partially obstructed for example by way of a punch grid 106, mesh, louvers, or like arrangement. The shelf or similar area, alone or in combination with punch grid 106 or similar opening cover, may be shaped and sized to prevent or reduce the entry of water or other substance from entry into conduit and traversal through conduit into enclosure 101.

As warmed air is removed from the enclosure 101 a negative pressure is created and thus cool air is drawn in from the ambient environment, as indicated in FIG. 1 via the solid arrow. The ambient air enters the enclosure 101 via a second damper 104b, which similar to damper 104a may include one or more blades 105. This permits the cooling air to enter the enclosure 101 and reduce the temperature.

The example of FIG. 2(A-B) shows the dampers 204a or 204b, which may have identical configuration (e.g., size, shape, or material construction) or may be different in some aspect to configuration (e.g., size, shape, or material construction). In an embodiment, either or both dampers 204a, 204b may be a damper such as damper 104a or damper 105b, or both, of FIG. 1, each of which includes movable blades (collectively indicated at 105 of FIG. 1).

Figure 2A:
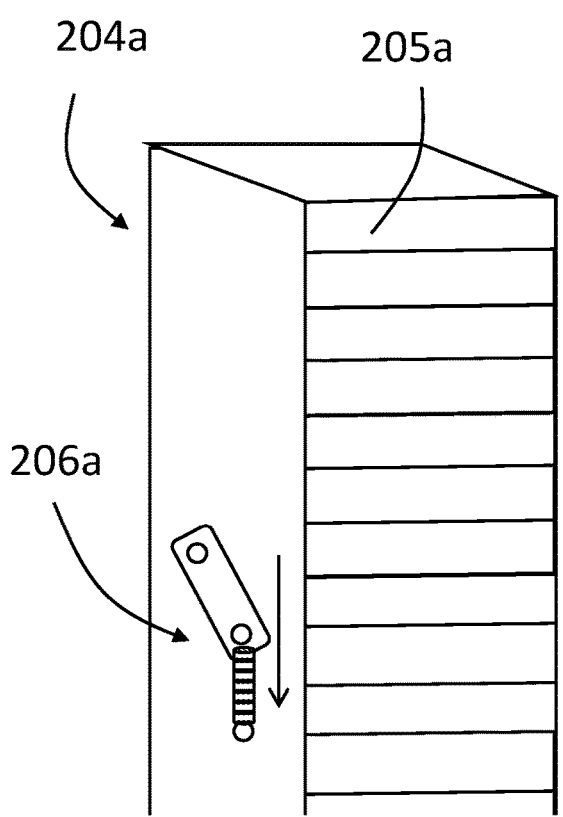
FIG. 2(A-B) illustrates a view of an example dampers.

In FIG. 2A, an example of a damper 204a is illustrated in which the blade(s) 205a are biased closed via a spring mechanism 206a, which may assist gravity in closing the blades 205a, depending on the orientation of the damper 204a, the blades 205a, or both. In the example of FIG. 2A, the blades, one of which is indicated at 205a, are biased closed via a spring mechanism 206a. This keeps the blades in a closed position, reducing or eliminating air flow as well as other materials such as contaminates, water, etc. and protecting the interior of the enclosure 101.

Figure 2B:
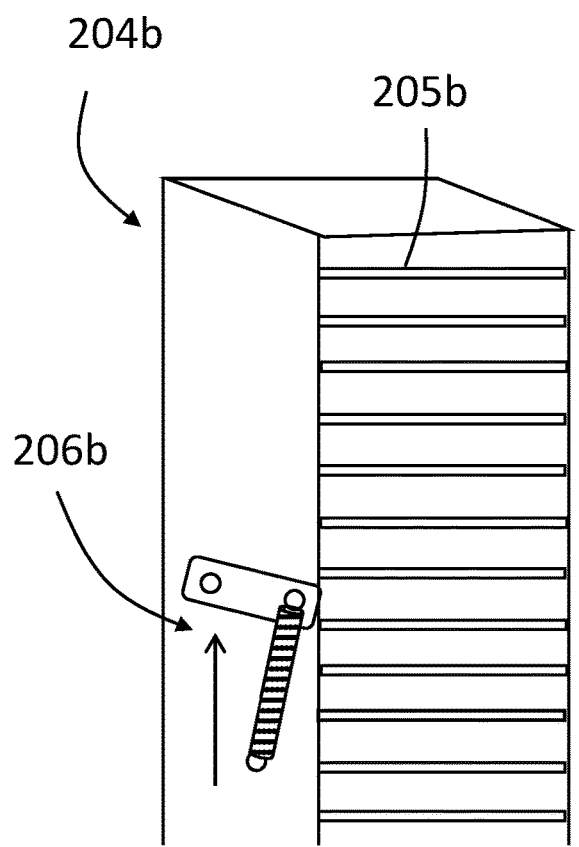

As shown in FIG. 2B, the damper 204b is in an open position where spring mechanism 206b has transitioned via movement of the blade(s), one of which is illustrated at 205b. This occurs for example in an embodiment in a purely mechanical fashion as a result of the movement of air via a fan (e.g., fan 103 of FIG. 1) and pressure that results from the movement of the air in an enclosure, such as enclosure 101. Thus, the dampers 104a, 104b of FIG. 1 may be mechanical dampers of very simple, reliable and economical construction. FIG. 2A-B therefore illustrate closed and open positions of the dampers 205a-b, the transition there-between being controlled by the operation of a fan 103 or suitable source of motion for the air flow.

Referring back to FIG. 1, it will be readily understood that the operation of the fan 103 and thus the opened or closed position of the dampers 104a-b may be controlled by electronics, for example including a thermostat 108, which in one example may be an open on rise thermostat, coupled to controller 107, which is configured to utilize AC and DC power inputs.

Figure 3:
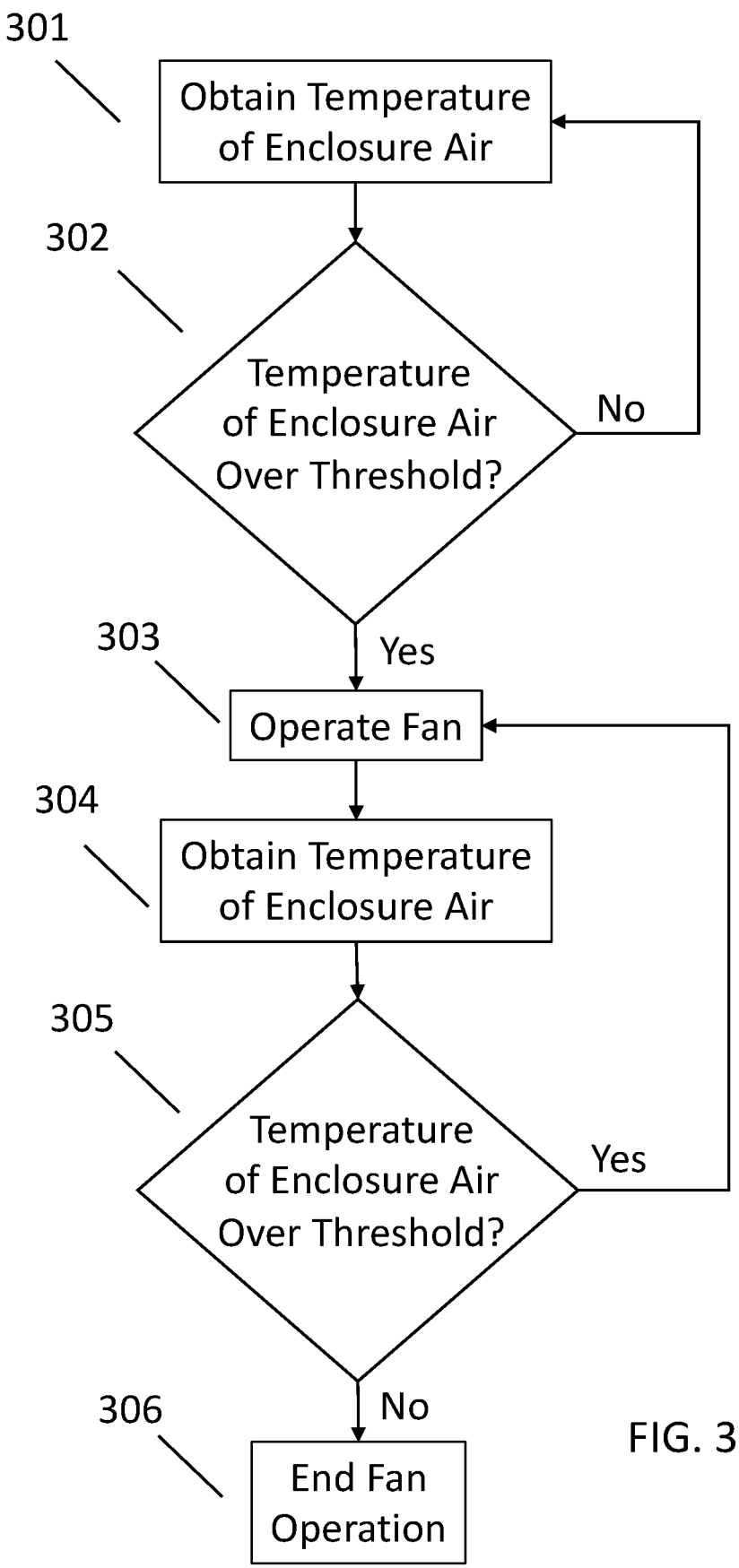
FIG. 3 illustrates an example method of operating a venting system.

Turning now to FIG. 3, an example of the operation of the venting system is provided. By the example of FIG. 3 it may be appreciated that the temperature of the enclosure 101 may be used to control the operation of the venting system 102. As illustrated, the temperature of the enclosure air is obtained at 301, e.g., via reading data being transmitted form a thermostat 108 to the controller 107 of FIG. 1. The temperature of the enclosure air is compared to a threshold at 302, e.g., via logic supplied by circuitry or programmable software of the controller. For example, the threshold may be a set point for the upper air temperature of the air in the enclosure 101, where the threshold is exceeded if the setpoint is achieved. The setpoint may be input and modified for example via a user interface, such as a touch control panel provided with the controller 107, e.g., facing the enclosure side.

If the temperature exceeds the threshold as determined at 302 then a fan such as fan 103 is brought into operation. Otherwise, the fan is not brought into operation and the temperature in any case may continue to be monitored. At or after the beginning of the fan operation at 303 the dampers, e.g., dampers 104a-b of FIG. 1, will be forced open via mechanical action as the result of the air flow induced by the fan and consequent pressure differential between the enclosure and the ambient environment. As discussed in FIG. 3, this may be sufficient force to overcome a bias supplied by a mechanism such as spring mechanism 206a-b (or similar) or via gravity (if no biasing mechanism is supplied) or both (if a biasing mechanism is supplied to damper and the natural action of gravity biases the damper blade(s) closed).

A controller or similar logic or circuitry may continue to monitor the temperature inside the enclosure as indicated at 304 and in the event that the air temperature exceeds the threshold (which may be the same threshold as that used in step 302, but need not be), the fan operation may continue. Otherwise, the fan operation may cease, as indicated at 306.

In an embodiment, the venting system 102 may be used as an auxiliary or "back-up" cooling system to supplement an existing air conditioning unit in enclosure 101 or the venting system 102 may be used as a primary cooling system for temperature sensitive equipment or components contained in an existing enclosure 101. The venting system 102 is in air flow communication with the enclosure 101 such that ambient air may be directed into the enclosure from the venting system 102 and exhausted from the enclosure 101 through the venting system 102. An embodiment may be adopted and configured to be added onto existing temperature sensitive components or equipment enclosures that have been previously equipped with their own existing air conditioning unit.

In an embodiment, a reduced set of mechanical and electrical components are used by the venting system 102. By way of example, mechanical dampers are used and direct control of the mechanical dampers, e.g., dampers 104a-b, for example via actuation of an electrical motor for each damper via controller 107, is not needed. Rather, the mechanical dampers are passively controlled by operation of a fan, e.g., fan 103, whether a single fan or more than one fan.

A controller 107, various other components such as the fan 103, thermostat(s) or relays, or a combination thereof may derive power from the enclosure 101 itself of via another source, such as an external power source from a commercial or municipal supplier, a battery, or a combination of the foregoing. In one embodiment the venting system 102 and components thereof may be configured to respond to loss of power, e.g., when used as a backup cooling system.

By way of example, in an embodiment, the venting system 102 may operate, e.g., via logic of the controller 107 or other circuitry, to sense loss or gain of a signal, such as a loss of AC power supply via the commercial power supply, a loss of operation of a main or primary air conditioner associated with an enclosure such as enclosure 101, or the like. The loss or gain of a signal may be used, e.g., by controller 107 of venting system 102, to take predetermined actions. By way of example, the venting system 102 may be configured to begin operation of the fan 103 in response to loss of AC power or detection that a primary air conditioner has ceased operating, e.g., via an open on rise thermostat triggering. This may take place nearly immediately or after a delay factor, such as a time delay or temperature delay. Depending on the signal(s) lost or gained, different actions may occur. For example, an automated switch to DC battery power may follow loss of main AC power supplied by the enclosure or a commercial supplier. In one example, signal loss may be treated as a replacement for the threshold illustrated in FIG. 3, e.g., signal loss substitutes for temperature exceeding a threshold in FIG. 3, triggering fan operation.

A combination of signal(s), lost or gained, e.g., temperature change and power loss, may be used to modify the flow of FIG. 3. For example, a power loss with or without temperature increase may trigger fan 103 operation, whereas power restoration without temperature decrease may result in the fan 103 ceasing operation for a predetermined time delay, which is adjustable, following which the venting system 102 may again become operational, e.g., if temperature remains above a set point after AC power restoration and operation. As another example, temperature decrease without AC power restoration may result in the fan 103 ceasing operation, at least temporarily, e.g., based on temperature monitoring or via a predetermined routine (such as operating the fan 103 via DC battery power intermittently for a period of minutes while power is out).

In an embodiment a relay or time delay mechanism may be used to provide a predetermined time delay to venting system 102 operation. By way of example, this may occur following loss of AC power for the enclosure 101. By way of specific example, immediately or within a short time period after AC power is lost at the enclosure 101, the venting system 102 may be triggered to turn on, e.g., via switch to utilize DC power, similar to heat generating components within the enclosure 101. After AC power is restored, a time delay may be implemented, e.g., 4 minutes to 16 minutes (adjustable), following power restoration during which the venting system 102 does not power on an allows a primary air conditioner of the enclosure 101 to attempt to regain control of the temperature of the enclosure 101. That is, loss of AC power permits the venting system 102 to temporarily operate and following restoration, the venting system 102 may cease operation for a time delay. As with other embodiments, readings from the thermostat 108 may influence the operation of the venting system 102, e.g., thermostat 108 may be used as an additional or sole determining signal for operation of the venting system 102.

In an embodiment, circuitry may be used in an AC power only venting system 102. In this example, DC power is not utilized and the venting system 102 is reliant on the AC power supply of the enclosure 101 (or otherwise reliant on a commercial power supply). As such, when AC power is lost, the venting system 102 ceases operation. In such an embodiment, the venting system 102 may be used as an auxiliary or supplemental cooling system to assist the primary air conditioner as its primary role. Nonetheless, such an AC only venting system 102 may also be utilized as the primary or only venting system if desirable when power is supplied to the AC unit.

In an embodiment, circuitry may be used in an AC/DC powered venting system 102. In such an embodiment, on AC power loss, the venting system 102 operates, e.g., almost instantaneously, using DC power supplied by a battery or other DC power source. The circuitry in such an embodiment includes a relay to implement a time delay as well as an open on rise thermostat configuration. In one example, the restoration of AC power may be followed by monitoring of the thermostat readings and use of a time delay in operation of the venting system 102, as described herein.

Figure 4:
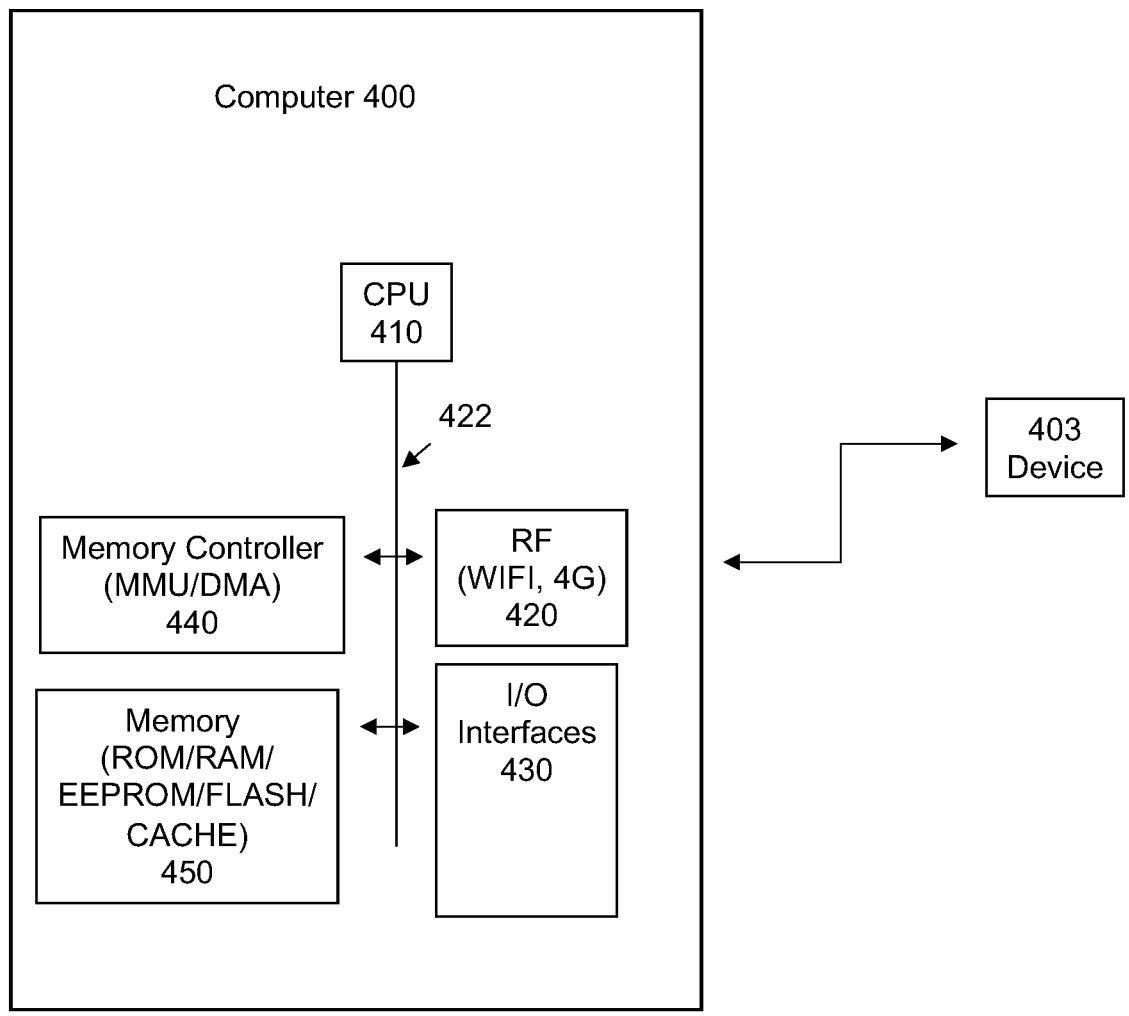
FIG. 4 illustrates an example system.

Remote (e.g., ethernet) communication or manual data entry is able to control the fan 103 and other function(s) and component(s) of the venting system 102, including thermostat 108. It therefore will be readily understood that certain embodiments can be implemented using any of a wide variety of devices or combinations of devices. Referring to FIG. 4, an example device that may be used in implementing one or more embodiments includes a controller in the form of a computing device (computer) 400, for example included in an embodiment, component thereof such as a controller 107, and/or another system (e.g., a tablet, laptop or desktop computer).

The computer 400 may execute program instructions or code configured to store and process data and perform other functionality of the embodiments. Components of computer 400 may include, but are not limited to, a processing unit 410, which may take a variety of forms such as a central processing unit (CPU), a graphics processing unit (GPU), a programmable circuit or other programmable hardware, a combination of the foregoing, etc., a system memory controller 440, memory 450, and a system bus 422 that couples various system components including the system memory 450 to the processing unit 410. It is noted that in certain implementations, computer 400 may take a reduced or simplified form, such as a micro-control unit implemented in a control panel of an air conditioner, where certain of the components of computer 400 are omitted or combined, or computer 400 may be supplemented or replaced by circuitry, e.g., circuitry as described in connection with AC only and AC/DC power supply scenarios.

Referring again to FIG. 4, the computer 400 may include or have access to a variety of non-transitory computer readable media. The system memory 450 may include non-transitory computer readable storage media in the form of volatile and/or nonvolatile memory devices such as read only memory (ROM) and/or random-access memory (RAM). By way of example, and not limitation, system memory 450 may also include an operating system, application programs, other program modules, and program data. For example, system memory 450 may include application programs such as fan control software and/or air conditioner operational software. Data may be transmitted by wired or wireless communication, e.g., to or from first device to another device, e.g., communication between a remote device or system such as computer 400 and a device 403, e.g., a fan such as fan 103 of FIG. 1.

A user can interface with (for example, enter commands and information) the computer 400 through input devices such as a touch screen, keypad, etc. A monitor or other type of display screen or device may also be connected to the system bus 422 via an interface, such as an interface 430. The computer 400 may operate in a networked or distributed environment using logical connections to one or more other remote computers or databases. The logical connections may include a network, such local area network (LAN) or a wide area network (WAN) but may also include other networks/buses.

It should be noted that various functions described herein may be implemented using processor executable instructions stored on a non-transitory storage medium or device. A non-transitory storage device may be, for example, an electronic, electromagnetic, or semiconductor system, apparatus, or device, or any suitable combination of the foregoing. More specific examples of a non-transitory storage medium include the following: a portable computer diskette, a hard disk, a random-access memory (RAM), a read-only memory (ROM), an erasable programmable read-only memory (EPROM or Flash memory), a portable compact disc read-only memory (CD-ROM), a solid-state drive, or any suitable combination of the foregoing. In the context of this document "non-transitory" media includes all media except non-statutory signal media.

Program code embodied on a non-transitory storage medium may be transmitted using any appropriate medium, including but not limited to wireless, wireline, optical fiber cable, RF, etc., or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), a personal area network (PAN) or the connection may be made through other devices (for example, through the Internet using an Internet Service Provider), through wireless connections, or through a hard wire connection, such as over a USB or another power and data connection.

Example embodiments are described herein with reference to the figures, which illustrate various example embodiments. It will be understood that the actions and functionality may be implemented at least in part by program instructions. These program instructions may be provided to a processor of a device to produce a special purpose machine, such that the instructions, which execute via a processor of the device implement the functions/acts specified.

It is worth noting that while specific elements are illustrated in the figures, and a particular ordering or organization of elements or steps has been illustrated, these are non-limiting examples. In certain contexts, two or more elements or steps may be combined into an equivalent element or step, an element or step may be split into two or more equivalent elements or steps, or certain elements or steps may be re-ordered or re-organized or omitted as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected by one skilled in the art without departing from the scope or spirit of the disclosure.

What is claimed is:

1. A venting system for attachment to an enclosure configured for housing heat generating components, the enclosure having a primary air conditioner, the venting system comprising:
    a vent housing comprising:
        a warm air conduit formed in a top area by a roof (110) and a stepped element (111) that includes a shelf, the shelf being interior to a first opening and cover (106) of the warm air conduit configured for warm air exhaust from the enclosure, the warm air conduit comprising a fan (103), the fan having an unimpeded flow access to, and being configured to expel warm air from the enclosure via, a first damper (104a) disposed atop the shelf and offset from the first opening, the first damper oriented vertically and comprising first blades that are biased closed and configured to be opened by operation of the fan to permit warm air exhaust from the enclosure and out of the first opening; and
        a lower area comprising a cool air inlet and second damper (104b) having blades biased closed, wherein the blades of the second damper are configured to be opened by operation of the fan creating negative pressure in the enclosure, the second damper being oriented tangentially to the first damper and separated from the first damper by the stepped element, the second damper permitting flow of cooling air into the enclosure;
    wherein the fan is configured to, under operation with alternating current power lost and loss of the operation of the primary air conditioner, operate to create a negative pressure in the enclosure, passively opening the blades of the second damper and permitting the flow of cooling inward through the second damper.

2. The venting system of claim 1, comprising springs configured to bias the first and second dampers in biased closed positions.

* * * * *